(12) United States Patent
Griffin et al.

(10) Patent No.: US 9,559,287 B2
(45) Date of Patent: Jan. 31, 2017

(54) ORTHOTROPIC BIMORPH FOR IMPROVED PERFORMANCE SYNTHETIC JET

(71) Applicant: The Boeing Company, Chicago, IL (US)

(72) Inventors: Steven F. Griffin, Kihei, HI (US);
Edward A. Whalen, Webster Groves, MO (US)

(73) Assignee: The Boeing Company, Chicago, IL (US)

( * ) Notice: Subject to any disclaimer, the term of this patent is extended or adjusted under 35 U.S.C. 154(b) by 210 days.

(21) Appl. No.: 14/329,680

(22) Filed: Jul. 11, 2014

(65) Prior Publication Data

US 2016/0013395 A1    Jan. 14, 2016

(51) Int. Cl.
| | |
|---|---|
| *B05B 1/08* | (2006.01) |
| *H01L 41/09* | (2006.01) |
| *B05B 17/06* | (2006.01) |
| *B64C 23/00* | (2006.01) |
| *F15D 1/00* | (2006.01) |
| *F15D 1/12* | (2006.01) |

(Continued)

(52) U.S. Cl.
CPC ....... *H01L 41/0973* (2013.01); *B05B 17/0607* (2013.01); *B05B 17/0615* (2013.01); *B64C 23/00* (2013.01); *F15D 1/0095* (2013.01); *F15D 1/12* (2013.01); *H01L 41/0472* (2013.01); *H01L 23/467* (2013.01); *H01L 2924/0002* (2013.01)

(58) Field of Classification Search
CPC .. B05B 17/0607; B05B 17/0615; B05B 17/06; H01L 41/0973; H01L 41/0472; H01L 23/467; H01L 2924/0002; B64C 23/00; F15D 1/0095; F15D 1/12

USPC .................. 239/102.1, 102.2; 310/324, 328
See application file for complete search history.

(56) References Cited

U.S. PATENT DOCUMENTS

| | | |
|---|---|---|
| 5,758,823 A | 6/1998 | Glezer et al. |
| 7,686,257 B2 | 3/2010 | Saddoughi et al. |

(Continued)

FOREIGN PATENT DOCUMENTS

| | | |
|---|---|---|
| CN | 101646116 A | 2/2010 |
| WO | 2012/002942 A1 | 1/2012 |

OTHER PUBLICATIONS

"Electroactive Polymer Synthetic Jet Actuators ("EJETs") for Low Speed Active Flow Control"; Morpheus Laboratory Department of Aerospace Engineering.

(Continued)

*Primary Examiner* — Steven J Ganey
(74) *Attorney, Agent, or Firm* — Miller, Matthias & Hull LLP (57) ABSTRACT

Piezoelectric actuators for synthetic jets and other devices are disclosed having orthotropic piezoelectric bimorphs with increased out-of-plane displacements for greater responsiveness to applied electric fields. In some embodiments, the piezoelectric actuators may include interdigitated electrodes applied to a surface of a piezoelectric plate to produce greater in-plane strains in the plate and greater out-of-plane displacements of a flexible diaphragm of the synthetic jet. In other embodiments, the actuator includes an orthotropic piezoceramic plate having a greater d coupling coefficient in one in-plane direction and in the other in-plane direction to cause desired diaphragm out-of-plane displacements when an electric field is applied by electrodes.

17 Claims, 6 Drawing Sheets

(51) Int. Cl.
*H01L 41/047* (2006.01)
*H01L 23/467* (2006.01)

(56) References Cited

U.S. PATENT DOCUMENTS

| | | | | |
|---|---|---|---|---|
| 8,006,917 | B2 * | 8/2011 | Arik | F15D 1/00 |
| | | | | 239/102.2 |
| 8,052,069 | B2 | 11/2011 | Xu et al. | |
| 8,931,714 | B1 * | 1/2015 | Pitt | F04F 5/00 |
| | | | | 239/102.1 |
| 2009/0244129 | A1 | 10/2009 | Katayama et al. | |
| 2011/0147476 | A1 | 6/2011 | Saddoughi et al. | |
| 2012/0091266 | A1 | 4/2012 | Whalen et al. | |
| 2013/0336820 | A1 | 12/2013 | Griffin et al. | |

OTHER PUBLICATIONS

"Secondary Flow Structures Due to Interaction Between a Finite-Span Synthetic Jet and a 3-D Cross Flow"; CeFPaC The Center for Flow, Physics, and Control; Rensselaer School of Engineering; Sponsor: AFOSR; Project Duration: Apr. 2008-May 2011; PI: Professor Miki Amitay: Graduate Student: Joseph Vasile.

"Evaluation and Opportunities for Use of Thin Form Factor Synthetic Jets to Low Profile Electronics Cooling Applications"; Dec. 18, 2012; By: Peter de Bock, Andrew Mann and Bryan Whalen; Issued Dec. 2012.

International Search Report for related International Application No. 15174291.3; report dated Oct. 12, 2015.

\* cited by examiner

ORTHOTROPIC BIMORPH FOR IMPROVED PERFORMANCE SYNTHETIC JET

TECHNICAL FIELD

The present invention relates generally to piezoelectric actuators and, in particular, to piezoelectric actuators for synthetic jets and other devices having orthotropic piezoelectric bimorphs with increased out-of-plane displacements for greater responsiveness to applied electric fields.

BACKGROUND

In recent years, active flow control has been used to increase the aerodynamic efficiency of machines having air flow over a surface, in particular vehicles such as airplanes. Adverse fluid flows generated over aerodynamic surfaces can buffet and fatigue downstream structures exposed to the flows, and the flows can affect efficiency by increasing drag or resistance over the surface. In one version of active flow control, jets of air are blown into the path of the adverse fluid flows to mix with the flows and cause the air to flow more smoothly over the aerodynamic surfaces and reduce the drag and resistance over the surfaces. In many cases, such active flow control can be implemented in existing vehicle designs without needing significant changes thereby directly reducing the operating cost of the vehicle or other machine.

One device for creating jets of air in active flow control is a synthetic jet that forms a jet flow by moving air back and forth through a small opening of the device. Synthetic jets typically have a housing in the shape of a hollow box or cylinder with a resonant chamber therein and an orifice or nozzle opening through one of the side or end walls. At least one wall of the synthetic jet is formed from a flexible membrane that can deflect inwardly and outwardly to alternately decrease and increase the volume in the resonant chamber and expel and draw in air through the opening. Deflection of the membrane may be caused by a piezoelectric actuator that responds to an applied electric field. The piezoelectric actuator may include a piezoceramic plate having a surface facing and rigidly attached to a corresponding surface of the membrane. The actuator may have a single piezoceramic plate attached to a surface of the membrane, or two piezoceramic plates with each plate being attached in a similar manner to one of the opposing surfaces of the membrane.

For each piezoceramic plate, electrodes are attached to the opposing planar surfaces for application of the electric field across the thickness of the plate. Due to the converse piezoelectric effect, the applied electric field causes stresses and mechanical deformation through the thickness of the plate, and corresponding stresses and mechanical deformation occur in the plane of the plate due to the Poisson effect. In-plane deformation of the plate creates bending moments on the surface of the membrane and deflection of the membrane relative to the resonant chamber. Alternating the polarity of the electric fields across the plates causes the plates to alternately compress and elongate. Alternating the electric field at a high frequency causes rapid vibration of the membrane and creation of high velocity flow through the opening of the synthetic jet.

In piezoelectric actuators as described, the electric field is applied through the thickness of the piezoceramic plates, but the actuators rely on the in-plane properties and mechanical deformation of the plate to apply the moment that bends the membrane. However, due to the Poisson ratios for the commonly used isotropic piezoceramics, the in-plane piezoelectric d coupling coefficients, which are ratios of the mechanical strain developed versus the applied electrical field, are between a factor of two to three times less than the transverse piezoelectric d coupling coefficient. As a result, the in-plane strains are one half to one third less than the transverse strains for an applied electrical field, thereby inherently limiting the response of the actuators to the electric energy applied across the thickness of the piezoceramic plates. In view of this, a need exist for improved piezoelectric actuators that are more efficient in utilizing the electric energy available for operation.

SUMMARY OF THE DISCLOSURE

In one aspect of the present disclosure, a piezoelectric actuator is disclosed. The piezoelectric actuator may a first plate having a planar first plate surface and an oppositely disposed planar second plate surface separated by a first plate thickness, a first electrode disposed on one of the planar first plate surface and the planar second plate surface and having a plurality of first fingers, and a second electrode disposed on the same one of the planar first plate surface and the planar second plate surface and having a plurality of second fingers alternated with the plurality of first fingers. The piezoelectric actuator may also include a flexible diaphragm having a first diaphragm surface and an oppositely disposed second diaphragm surface, wherein one of the planar first plate surface and the planar second plate surface of the first plate faces and is rigidly secured to the first diaphragm surface. A first electric field applied through the first electrode and the second electrode may cause in-plane tensile stresses to elongate the first plate in a first direction, may cause in-plane compressive stresses in a second direction, and may cause transverse compressive stresses in a third direction. A second electric field applied through the first electrode and the second electrode may cause compressive stresses to compress the first plate in the first direction, and may cause tensile stresses in the second direction and the third direction.

In another aspect of the present disclosure, a synthetic jet for generating an air jet is disclosed. The synthetic jet may include a housing defining a hollow resonant chamber and having an orifice through a first wall of the housing placing the hollow resonant chamber in fluid communication with an ambient atmosphere surrounding the synthetic jet, a flexible diaphragm forming a second wall of the housing and having a first diaphragm surface and an oppositely disposed second diaphragm surface, a flexible diaphragm forming a second wall of the housing and having a first diaphragm surface and an oppositely disposed second diaphragm surface, and a first plate having a planar first plate surface and an oppositely disposed planar second plate surface separated by a first plate thickness, wherein one of the planar first plate surface and the planar second plate surface of the first plate faces and is rigidly secured to the first diaphragm surface. The synthetic jet may also include a first electrode disposed on one of the planar first plate surface and the planar second plate surface and having a plurality of first fingers, and a second electrode disposed on the same one of the planar first plate surface and the planar second plate surface and having a plurality of second fingers alternated with the plurality of first fingers. A first electric field applied through the first electrode and the second electrode may cause in-plane tensile stresses to elongate the first plate in a first direction, may cause in-plane compressive stresses in a second direction, and may cause transverse compressive stresses in a third direction. A second electric field applied through the first electrode and the second electrode may cause compressive stresses to compress the first plate in the first direction, and may cause tensile stresses in the second direction and the third direction.

In another aspect of the present disclosure, a synthetic jet for generating an air jet is disclosed. The synthetic jet may include a housing defining a hollow resonant chamber and having an orifice through a first wall of the housing placing the hollow resonant chamber in fluid communication with an ambient atmosphere surrounding the synthetic jet, a flexible diaphragm forming a second wall of the housing and having a first diaphragm surface and an oppositely disposed second diaphragm surface, and a first orthotropic plate having a planar first plate surface and an oppositely disposed planar second plate surface separated by a first plate thickness. One of the planar first plate surface and the planar second plate surface of the first plate may face and be rigidly secured to the first diaphragm surface, the first orthotropic plate may have a first direction in the plane of the first orthotropic plate, a second direction in the plane of the first orthotropic plate, and a third direction transverse to the plane of the first orthotropic plate, and the first orthotropic plate may have a first d coupling coefficient in the first direction that is greater than a second d coupling coefficient in the second direction. The synthetic jet may further include a first electrode disposed on one of the planar first plate surface and the planar second plate surface, and a second electrode disposed on one of the planar first plate surface and the planar second plate surface. A first electric field applied through the first electrode and the second electrode may cause in-plane tensile stresses to elongate the first orthotropic plate in the first direction, and a second electric field applied through the first electrode and the second electrode may cause compressive stresses to compress the first orthotropic plate in the first direction.

Additional aspects are defined by the claims of this patent.

DETAILED DESCRIPTION

Although the following text sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

It should also be understood that, unless a term is expressly defined herein, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to herein in a manner consistent with a single meaning, that is done for sake of clarity only so as to not confuse the reader, and it is not intended that such claim term be limited, by implication or otherwise, to that single meaning.

Figure 1:
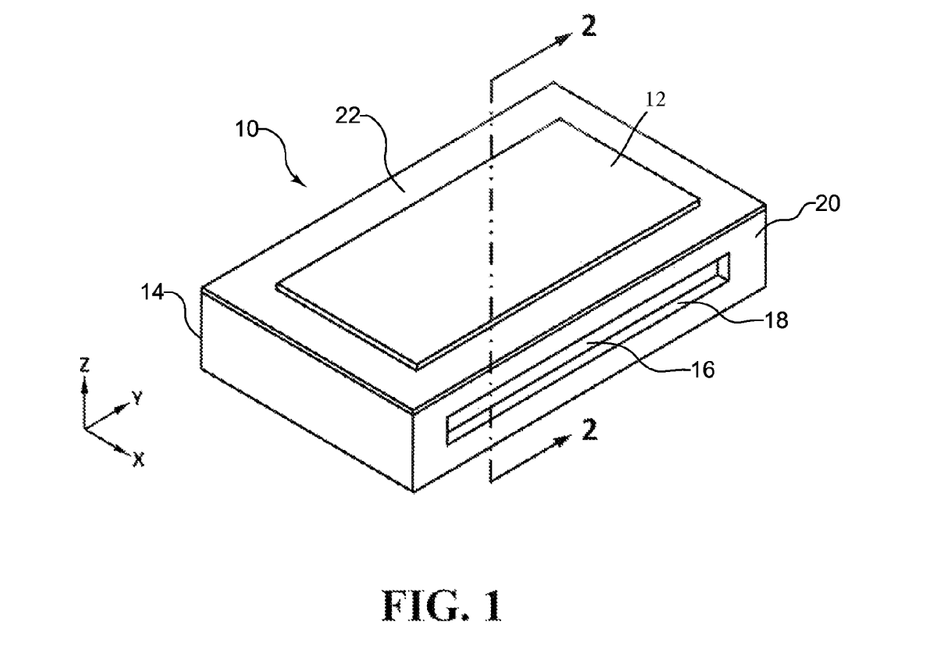
FIG. 1 is an isometric view of a synthetic jet in which a piezoelectric actuator in accordance with the present disclosure may be implemented.

FIG. 1 illustrates one exemplary device in the form of a synthetic jet 10 in which piezoelectric actuators 12 in accordance with the present disclosure may be implemented. The illustrative synthetic jet 10 has the shape of a rectangular prism, but synthetic jets known in the art may be cylindrical or have other appropriate shapes as necessary to create the desired air flow characteristics. The synthetic jet 10 has an outer housing 14 defining a resonant chamber 16 therein. An orifice 18 is defined through one wall 20 of the housing 14 to place the resonant chamber 16 in fluid communication with the ambient atmosphere surrounding the synthetic jet 10. At least one wall of the housing 14 is formed by a flexible material to create a membrane or diaphragm 22 that can vibrate to change the volume of the resonant chamber 16 to induce air to be alternately ejected from and drawn in through the orifice 18. The diaphragm 22 may be formed from flexible materials such as brass, copper or Kapton®, or any other appropriate material that is sufficiently flexible.

Figure 2A:
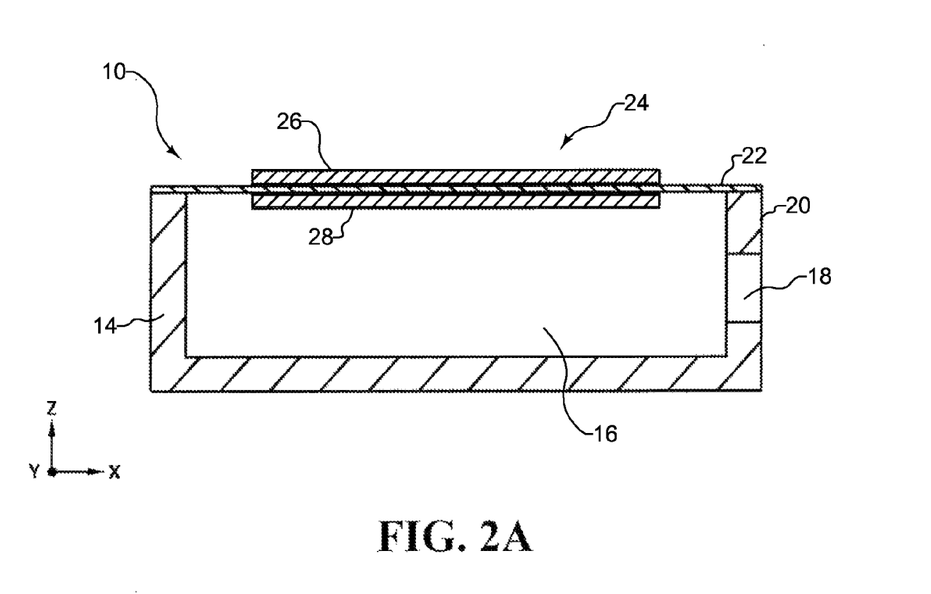
FIG. 2A is a cross-sectional view of the synthetic jet of FIG. 1 taken through line 2-2 with a previously-known piezoelectric actuator.

The Piezoelectric actuator 12 may be operatively connected to the diaphragm 22 to create bending moments that cause the diaphragm to deflect into and out of the resonant chamber 16 as discussed further below. FIG. 2A provides a cross-sectional view of the synthetic jet 10 with a previously known piezoelectric actuator 24. The actuator 24 includes a first planar piezoceramic plate 26 having one planar surface facing and rigidly connected to an outer surface of the diaphragm 22. An optional second planar piezoceramic plate 28 may be provided with one planar surface of the plate 28 facing and rigidly connected to an inner surface of the diaphragm 22.

Figure 2B:
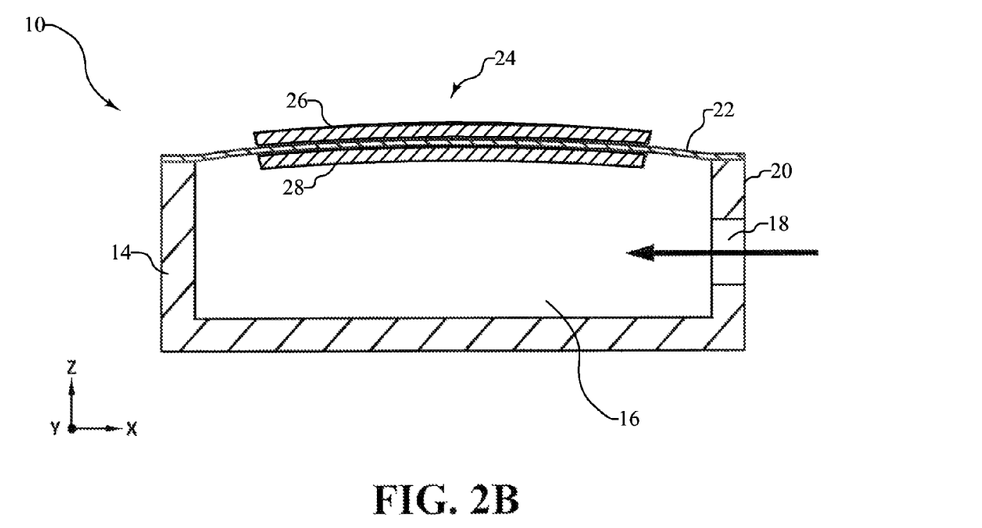
FIG. 2B is the cross-sectional view of the synthetic jet of FIG. 2A with the diaphragm deflected outwardly and drawing air into the resonant chamber.
Figure 2C:
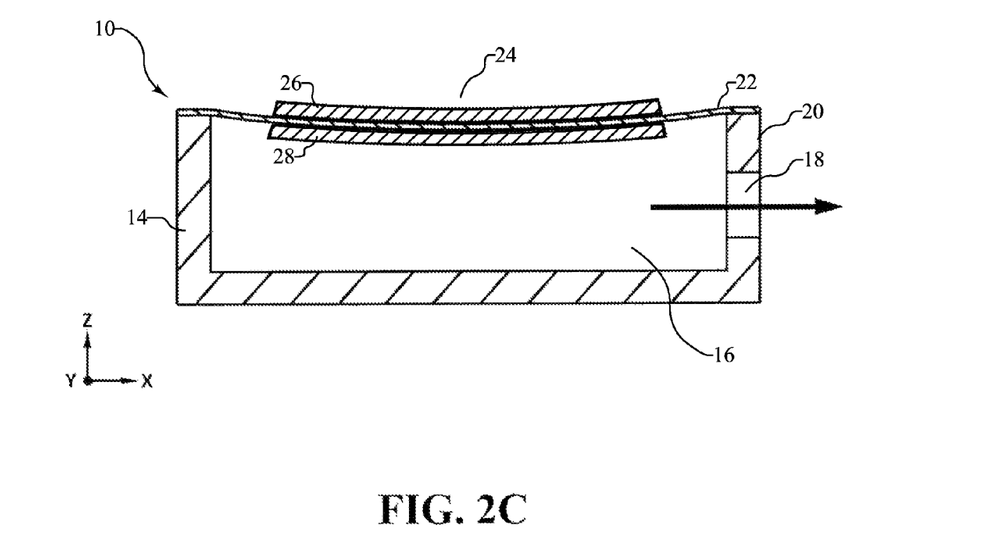
FIG. 2C is the cross-sectional view of the synthetic jet of FIG. 2A with the diaphragm deflected inwardly and discharging air through the orifice.

For each piezoceramic plate 26, 28, electrodes are placed on the opposing planar surfaces of the plates 26, 28 for application of voltages across the thicknesses of the plates 26, 28 to create transverse stresses in the plates 26, 28. The transverse stresses cause out-of-plane deformation of the plates 26, 28 in the Z-direction that result in the creation of in-plane stresses and corresponding deformations in the X- and Y-directions according to the Poisson ratio for the piezoceramic material. The piezoceramic material forming the plates 26, 28 has isotropic or quasi-isotropic characteristics so that the plates 26, 28 react consistently in the in-plane directions. The in-plane deformations of the plates 26, 28 create bending moments on the diaphragm 22 due to the rigid connection between the plates 26, 28 and the diaphragm 22. Resistance to in-plane elongation and compression of the plates 26, 28 at the interface results in deflection of the diaphragm to change the volume in the resonant chamber 16 as shown in FIGS. 2B and 2C. In FIG. 2B, the voltage applied by the electrodes across the first piezoceramic plate 26 causes the first piezoceramic plate 26 to expand and create a bending moment causing the diaphragm 22 to deflect outwardly. At the same time, the voltage applied by the electrodes across the second plate 28 causes the second plate 28 to contract and create a bending moment also causing the diaphragm 22 to deflect outward, and thereby increase the volume in the resonant chamber 16 and draw air in through the orifice 18. When polarity of the voltages across the plates 26, 28 are reversed, the bending moments on the diaphragm 22 are reversed and the diaphragm 22 deflects inwardly to decrease the volume in the resonant chamber 16 and discharge an air jet through the orifice 18 as shown in FIG. 2C.

Figure 3:
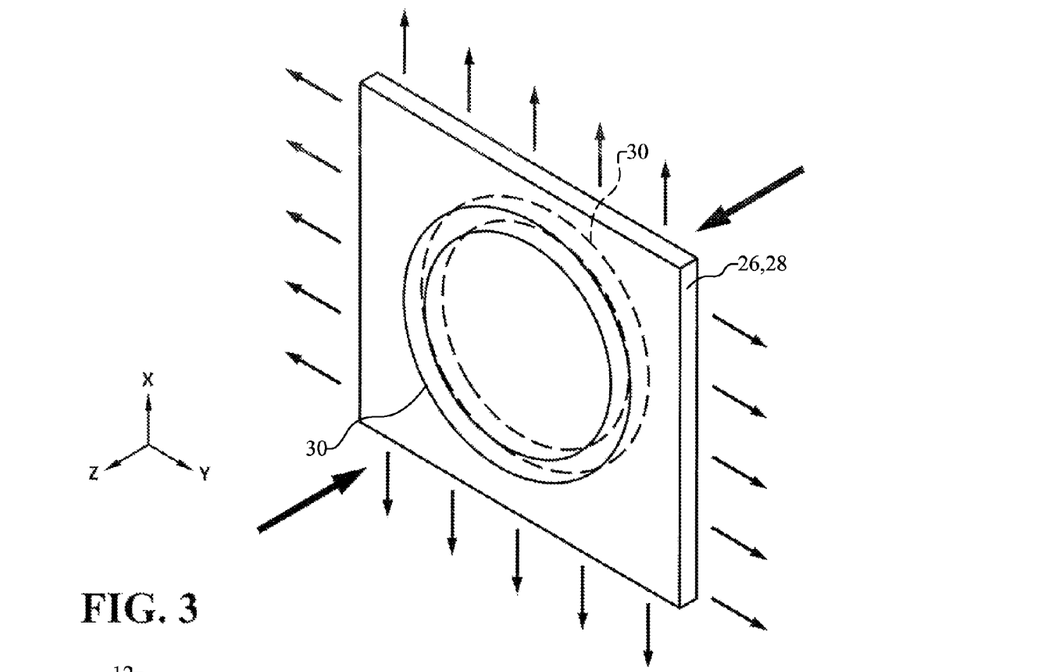
FIG. 3 is a schematic illustration of the stresses on the piezoceramic plate of the piezoceramic actuator of FIG. 2B.

As described above, the known piezoelectric actuators 24 have electrodes generating voltages through the thickness of the isotropic or quasi-isotropic piezoceramic plates 26, 28 in the Z- or out-of-plane direction. In FIG. 3, the voltage applied by electrodes 30 creates transverse compressive stresses tending to reduce the thickness of the plates 26, 28 as indicated by the arrows parallel to the Z-axis. Correspondingly, tensile stresses are created in the in-plane directions tending to increase the dimensions of the plates 26, 28 in the X- and Y-directions. When the voltage polarity is reversed, the plates 26, 28 experience transverse tensile stresses and in-plane compressive stresses. In the isotropic plates 26, 28, the magnitude of the in-plane stresses is equal in the X- and Y-directions. However, due to the Poisson ratios for the commonly used piezoceramics, the in-plane d coupling coefficients, which are ratios of the mechanical strain developed to the applied electrical field, are between a factor of two to three times less than the transverse d coupling coefficient so that the in-plane stresses are one half to one third less than the transverse stresses.

Figure 4:
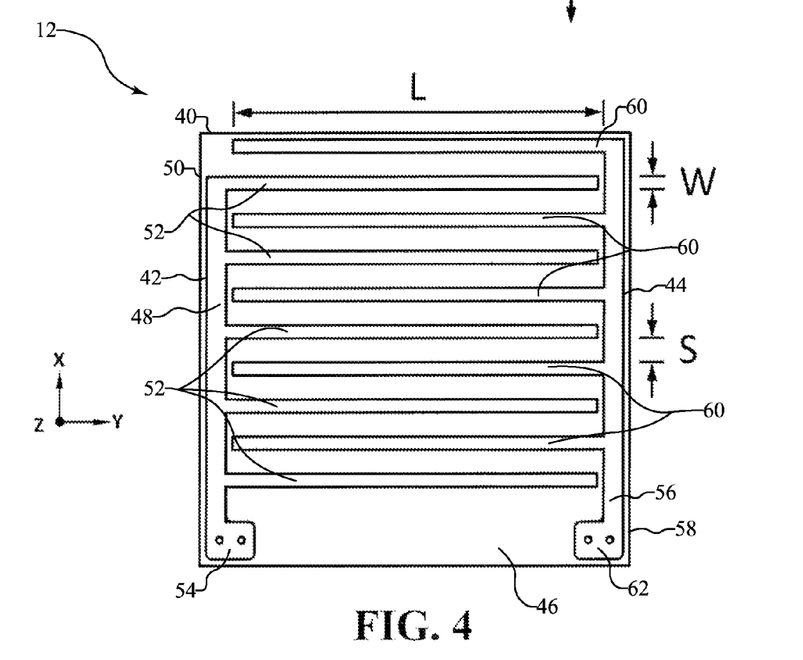
FIG. 4 is a front view of a rectangular piezoceramic plate with interdigitated electrodes of a piezoelectric actuator in accordance with the present disclosure.

FIG. 4 illustrates a first embodiment of the piezoelectric actuator 12 in accordance with the present disclosure having improved responsiveness by taking advantage of an in-plane d coupling coefficient having greater sensitivity to an applied electrical field. A bimorph of the actuator 12 may be fabricated from a traditional piezoceramic plate 40 similar to those describe above having first and second interdigitated electrodes 42, 44 applied to a first planar surface 46 of the piezoceramic plate 40. A similar arrangement of the electrodes 42, 44 may also be applied to a second planar surface on the opposite side of the plate 40. In this embodiment, the plate 40 is rectangular, but other shapes may be used depending on the requirements for a particular implementation in a synthetic jet 10 or other device. The first electrode 42 includes a first spine 48 extending along a first lateral edge 50 of the plate 40, and a plurality of parallel first fingers 52 extending there from across the first planar surface 46 of the plate 40. The first electrode 42 further includes a first lead 54 to provide a point of electrical connection to a first pole of a voltage source (not shown) that supplies electrical power to the actuator 12. The second electrode 44 includes a second spine 56 extending along a second lateral edge 58 of the plate 40, a plurality of parallel second parallel fingers 60 extending there from across the first planar surface 46 of the plate 40 and alternating with the first fingers 52 of the first electrode 42, and a second lead 62 for connection of a second pole of the voltage source. The electrodes 42, 44 may have a total of N fingers (five fingers per electrode 42, 44 for a total of ten fingers), with each finger 52, 60 having a finger length L and a finger width W so that the electrodes define N−1 gaps there between (nine gaps in the example) having a gap separation width S. A similar arrangement of the electrodes 42, 44 on the second planar surface of the plate 40 may have a similar orientation with the spines 48, 56 extending along the lateral edges 50, 58, and a similar connection to the voltage source so that the voltages applied the planar surfaces have the same polarity.

Figures 5, 6:
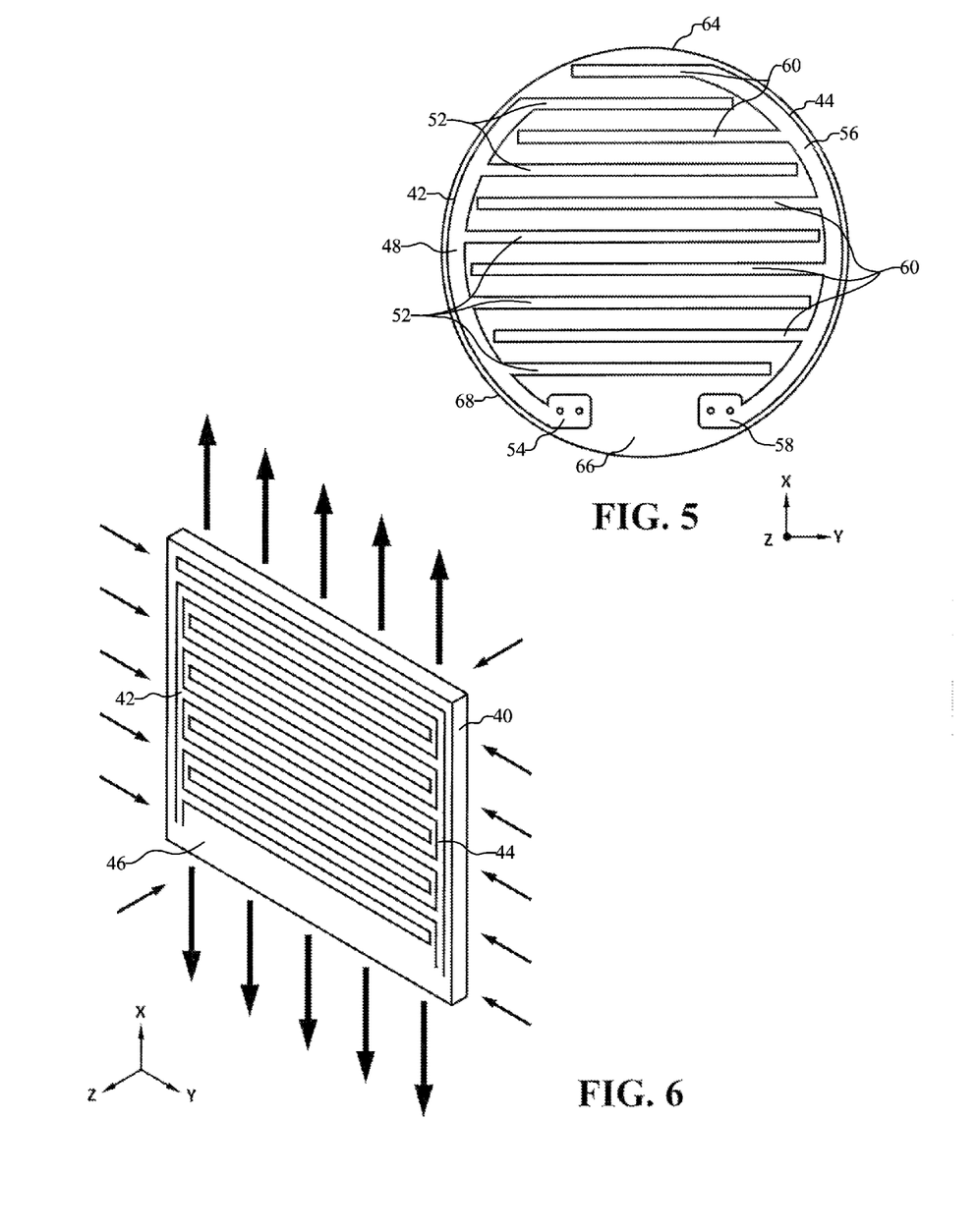
FIG. 5 is a front view of a circular piezoceramic plate with interdigitated electrodes of a piezoelectric actuator in accordance with the present disclosure.
FIG. 6 is a schematic illustration of the stresses on the rectangular piezoceramic plate of FIG. 4.

The interdigitated electrodes 42, 44 may similarly be applied to piezoceramic plates having other geometries with appropriate modifications being made to conform to the shapes of the plates. For example, FIG. 5 shows an embodiment of a circular piezoceramic plate 64 with adapted versions of the interdigitated electrodes 42, 44 applied to a first planar surface 66. In this embodiment, the spines 48, 56 of the electrodes 42, 44 may be curved to conform to the curvature of an outer edge 68 of the plate 64, with the fingers 52, 60 extending inwardly from inward edges of the spines 48, 56. To compensate for the curvature of the plate 64 and the varying dimension in the Y-direction, the fingers 52, 60 may have variable finger lengths L to ensure full coverage across the planar surface 66 without contacting the spine 48, 56 of the opposite electrode 42, 44.

Figure 7:
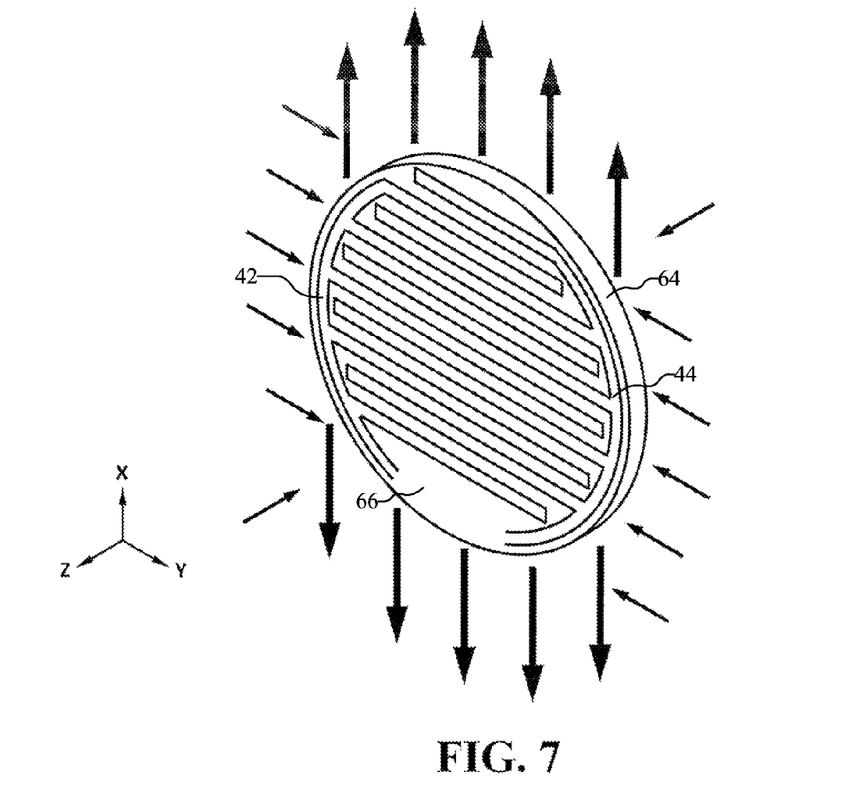
FIG. 7 is a schematic illustration of the stresses on the rectangular piezoceramic plate of FIG. 5.

The arrangement of the interdigitated electrodes 42, 44 on the plates 40, 64 provides both positive and negative poles on the same surface so that voltage is applied in an in-plane direction to maximize the benefit of the in-plane d coupling coefficient of the piezoceramic material. As shown in FIG. 6 for the rectangular piezoceramic plate 40, when the voltage is applied through the interdigitated electrodes 42, 44, larger in-plane tensile strains and corresponding stresses are created in the poling direction (X-direction). Consequently, application of the same voltage to the piezoceramic plate 40 with the interdigitated electrodes 42, 44 results in greater deformation of the plate 40 in the X-direction. At the same time, the Poisson effect stresses in the Y- and Z-directions are two to three times less than the stresses in the Y-direction for the reasons discussed above. When the polarity of the voltage applied to the plate 40 is reversed, the plate 40 will experience in-plane strains and corresponding compressive stresses in the X-direction, along with tensile stresses in the Y- and Z-directions that are two to three times less than the compressive stresses. Similar generation of stresses will occur in circular piezoceramic plate 64 as shown in FIG. 7, and those skilled in the art will understand that piezoceramic plates having other geometries will experience similar stresses, with the highest stresses occurring in the poling direction of the applied voltage.

In the synthetic jet 10 as arranged in FIG. 2A, the piezoceramic plate 40 with the interdigitated electrodes 42, 44 may be substituted for the plates 26, 28 on either side of the diaphragm 22. The pair of plates 40 may be arranged with the electrodes 42, 44 aligned so that the electric fields are applied in parallel directions, such as parallel to the X-direction of the synthetic jet 10. To cause deflection of the diaphragm 22 outward as shown in FIG. 2B, an electric field is applied to the upper or outer plate 40 to cause the outer plate 40 to elongate and apply a bending moment tending to deflect the diaphragm 22 upwardly. At the same time, the electric field is applied to the lower or inner plate 40 to cause the inner plate 40 to contract and apply a bending moment also tending to deflect the diaphragm 22 upwardly. When the electric fields are reversed, the outer plate 40 contracts and the inner plate 40 elongates to apply bending moments tending to deflect the diaphragm 22 downwardly or inwardly, and alternating the electric fields causes vibration of the diaphragm 22 to create the air jet discharged through the orifice 18.

Figure 8:
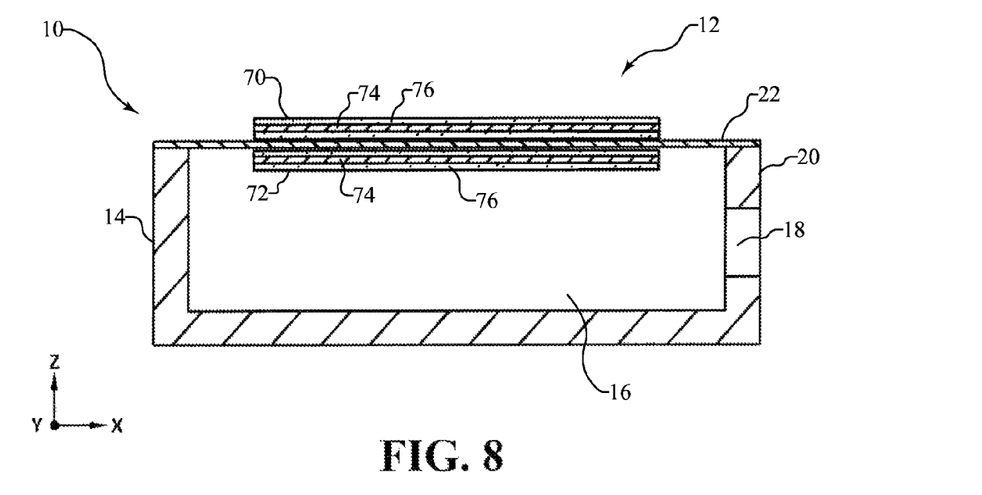
FIG. 8 is a cross-sectional view of the synthetic jet of FIG. 1 taken through line 2-2 with an alternative embodiment of a piezoelectric actuator in accordance with the present disclosure.

In an alternative embodiment of the piezoelectric actuator 12, desired response of the actuator 12 to voltages applied by either traditional or interdigitated electrodes may be achieved through the use of macrofiber piezoceramic plates. Macrofiber piezoceramic technology allows for the fabrication of plates exhibiting orthotropic behavior wherein the plates react differently in different directions to cause the desired amount of deformation when the voltage is applied by the electrodes. As an example, FIG. 8 illustrates the cross-section of the synthetic jet 10 of FIG. 2A wherein the isotropic or quasi-isotropic piezoceramic plates 26, 28 are replaced by macrofiber piezoceramic plates 70, 72. Each of the macrofiber piezoceramic plates 70, 72 may be formed with a bundle 74 formed by a plurality of piezoceramic fibers or rods aligned side-by-side across the width of the plates 70, 72 in the Y-direction. The bundle 74 may be fully or partially encased by an appropriate epoxy or polyurethane interstitial material 76.

As an example, the macrofiber piezoceramic plates 70, 72 may be fabricated in a manner that increases the piezoelectric d coupling coefficient in the X-direction as shown in FIG. 3 so that voltage applied by a traditional electrode arrangement used therein (electrode on each planar surface) may produce similar strains and corresponding stresses to those produced by the interdigitated electrodes as shown in FIG. 6. At the same time, the d coupling coefficients in the Y- and Z-directions will decrease because each of the piezoceramic fibers or rods in the bundle 74 will experience only localized elongation or shrinkage and the interstitial material 76 will be unaffected by an applied electrical field. Other material properties of the piezoceramic may be manipulated by macrofiber technology to achieve the desired response. For example, the composite piezoceramic may be fabricated to have a lower modulus of elasticity in the Z-direction than in the Y- and Z-directions so that the stresses shown in FIG. 3 result in greater deformation in the X-direction than in an isotropic piezoceramic plate. Of course, those skilled in the art will understand that the piezoelectric actuator 12 may include the interdigitated electrodes 42, 44 implemented in conjunction with the macrofiber piezoceramic plates 70, 72 to achieve the desired response from the synthetic jet 10 or other device in which the actuator 12 is implemented.

INDUSTRIAL APPLICABILITY

Figure 9:
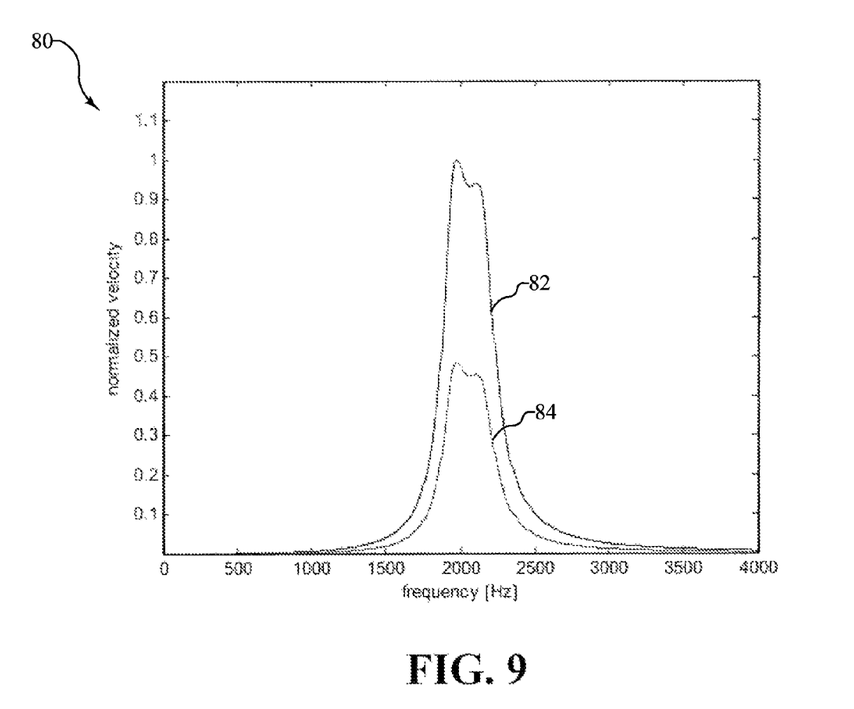
FIG. 9 is a graph of normalized air velocity versus frequency for synthetic jets having previously-known piezoelectric actuators and piezoelectric actuators in accordance with the present disclosure.

Piezoelectric actuators 12 in accordance with the present disclosure are more efficient in utilizing the electrical power available for operating the synthetic jet 10 or other device. FIG. 9 illustrates a graph 80 of a normalized air jet velocity versus a frequency of application of a voltage for the previously known electrodes 30 of FIG. 3 and the interdigitated electrodes of FIG. 4 for the rectangular piezoceramic plate 40. At the resonant frequency of the piezoceramic material, which is approximately 2,000 Hz in this example, the performance of the synthetic jet 10 when using the interdigitated electrodes 42, 44 as indicated by a curve 82 on the graph 80 such that the air velocity increases to more than twice the air velocity produced by the traditional electrodes 30 as shown by a curve 84. Consequently, the same applied voltage may yield twice the response with the interdigitated electrodes 42, 44 than the traditional electrodes 30, or the same response may be achieved using less electrical energy with the interdigitated electrodes 42, 44. Of course, the resonant frequencies for the piezoceramic materials and the scale will vary in practice, but the benefits of using the interdigitated electrodes 42, 44 will be realized. Similar performance improvements can be realized in synthetic jets 10 using piezoelectric actuators 12 with orthotropic macrofiber piezoceramic plates 70, 72 as described above. The increased in-plane forces and corresponding responsiveness of the orthotropic piezoelectric actuators 12 results in increased moment and increased displacement amplitude of the bimorph and the diaphragm 22 without a requirement for additional electrical power. In the case of the synthetic jet 10 with an orthotropic piezoelectric actuator 12, the increased responsiveness may be desirable to achieve increased bending or even buckling of the diaphragm 22 to pump more air out of the orifice 18 for the same electrical input.

The interdigitated electrodes 42, 44 and macrofiber piezoceramic plates 70, 72 may also facilitate tuning the performance of the piezoelectric actuator 12 to the properties of the synthetic jet 10 or other device in which the actuator 12 is implemented. By appropriate tailoring of the interdigitated electrodes 42, 44, orthotropic macrofiber piezoceramic plates 70, 72 or a combination of the two, an actuator 12 that exhibits a structural mode that better couples with the acoustic modes of the synthetic jet 10 can be constructed. As an example, a piezoelectric actuator 12 that displaces a greater distance in an area of the acoustic mode with relatively high pressure may more efficiently use the electrical power to create the air jet.

Figure 10:
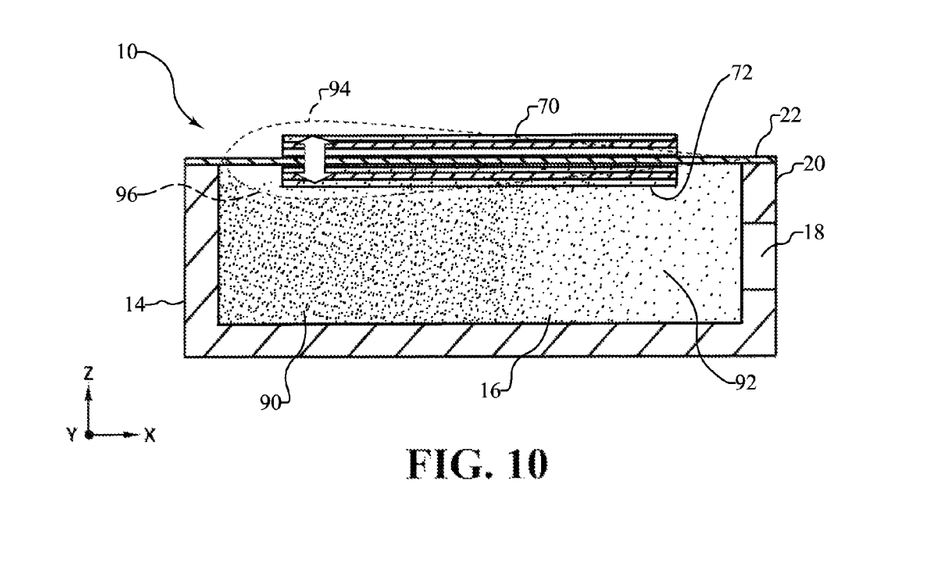
FIG. 10 is a cross-sectional view of the synthetic jet of FIG. 1 taken through line 2-2 with a further alternative embodiment of a piezoelectric actuator in accordance with the present disclosure.

FIG. 10 illustrates the synthetic jet 10 with the piezoelectric actuator 12 designed to better couple to acoustic modes of the resonant chamber 16 by having increased deflection of the diaphragm 22 proximate a high pressure area 90 within the resonant chamber 16 and less deflection in a low pressure area 92. With the interdigitated electrodes 42, 44 applied to the macrofiber piezoceramic plates 70, 72, the response of the diaphragm 22 indicated in FIG. 10 by curves 94, 96 may be achieved by providing a higher concentration of the electrode fingers 52, 60 proximate the high pressure area 90 to increase the electric field across the piezoceramic plate 40 in that region. The localized increase in the electric field causes a corresponding increase in the bending moment applied to the diaphragm 22 to generate greater deflection of the diaphragm 22. The higher concentration of electrode fingers 52, 60 may be attained by reducing the gap separation width S and having more electrode fingers 52, 60 in the high pressure area 90 than in the low pressure area 92, or by increasing the finger width W in the high pressure area 90. With the orthotropic macrofiber piezoceramic plates 70, 72, the composite piezoceramic material may be configured with greater elasticity and/or d coupling coefficients in the high pressure are 90 than in the low pressure area 92 and proximate the orifice 18 to achieve the desired deflection of the diaphragm 22. Such property variations across the plates 70, 72 may be accomplished by various methods, such as varying the composition and arrangement of the piezoceramic bundle 74 and interstitial material 76. The thicknesses of the plates 40, 70, 72 may also be varied so that the magnitude of the moment applied to the diaphragm 22 may be greater in areas where a larger deflection of the diaphragm 22 is beneficial. When interdigitated electrodes 42, 44 are applied to the plates 40, 70, 72, thicker portions of the plates 40, 70, 72 will experience a greater force when the electrical field is applied, resulting in a corresponding increase in the bending moment applied to, and increase in the inward or outward deflection of, the diaphragm 22.

Other configurations of the piezoelectric actuator 12 may be envisioned with the goal of better coupling of the structure and response of the actuator 12 to the acoustic modes of the synthetic jet 10 or other device. For example, the piezoelectric actuator 12 may use the interdigitated electrodes 42, 44 with localized concentrations of electrode fingers 52, 60 with the isotropic or quasi-orthotropic plates 40, 64, or may use the orthotropic macrofiber piezoceramic plates 70, 72 with the traditional electrodes 30 applying the voltage through the thickness of the plates 70, 72. In addition to the properties of the interdigitated electrodes 432, 44 and the plates 70, 72, the properties of the diaphragm 22 may be varied in an orthotropic way to increase the deflection of the diaphragm 22 in regions that make the synthetic jet 10 work more efficiently and in tune with its acoustics. Additional variations and combinations of the interdigitated electrodes 42, 44, the orthotropic macrofiber piezoceramic plates 70, 72 and the diaphragm 22 to match the acoustic modes of the devices in which the piezoelectric actuators 12 are implemented will be apparent to those skilled in the art based on the present disclosure, and such variations are contemplated by the inventors as having use in piezoelectric actuators 12 in accordance with the present disclosure.

While the preceding text sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

What is claimed is:

1. A piezoelectric actuator comprising:
   a first plate having a planar first plate surface and an oppositely disposed planar second plate surface separated by a first plate thickness;
   a second plate having a planar third plate surface and an oppositely disposed planar fourth plate surface separated by a second plate thickness;
   a first electrode disposed on one of the planar first plate surface and the planar second plate surface and having a plurality of first fingers;
   a second electrode disposed on the same one of the planar first plate surface and the planar second plate surface and having a plurality of second fingers alternated with the plurality of first fingers;
   a third electrode disposed on one of the planar third plate surface and the planar fourth plate surface and having a plurality of third fingers;
   a fourth electrode disposed on the same one of the planar third plate surface and the planar fourth plate surface and having a plurality of fourth fingers alternated with the plurality of third fingers; and
   a flexible diaphragm having a first diaphragm surface and an oppositely disposed second diaphragm surface, wherein one of the planar first plate surface and the planar second plate surface of the first plate faces and is rigidly secured to the first diaphragm surface, wherein one of the planar third plate surface and the planar fourth plate surface of the second plate faces and is rigidly secured to the second diaphragm surface,
   wherein a first electric field applied through the first electrode and the second electrode causes in-plane tensile stresses to elongate the first plate in a first direction, causes in-plane compressive stresses in a second direction, and causes transverse compressive stresses in a third direction, and wherein a second electric field applied through the first electrode and the second electrode causes compressive stresses to compress the first plate in the first direction, and causes tensile stresses in the second direction and the third direction, and
   wherein a third electric field applied through the third electrode and the fourth electrode causes in-plane tensile stresses to elongate the second plate in a fourth direction, causes in-plane compressive stresses in a fifth direction, and causes transverse compressive stresses in a sixth direction, and wherein a fourth electric field applied through the third electrode and the fourth electrode causes compressive stresses to compress the second plate in the fourth direction, and causes tensile stresses in the fifth direction and the sixth direction and wherein the first plate and the second plate are rigidly secured to the flexible diaphragm with the first direction of the first plate aligned parallel to the fourth direction of the second plate.

2. The piezoelectric actuator of claim 1, comprising
   a third electrode disposed on the other of the planar first plate surface and the planar second plate surface and having a plurality of third fingers; and
   a fourth electrode disposed on the other of the planar first plate surface and the planar second plate surface and having a plurality of fourth fingers alternated with the plurality of third fingers,
   wherein a third electric field applied through the third electrode and the fourth electrode causes in-plane tensile stresses to elongate the first plate in the first direction, causes in-plane compressive stresses in the second direction, and causes transverse compressive stresses in the third direction, wherein a fourth electric field applied through the third electrode and the fourth electrode causes compressive stresses to compress the first plate in the first direction, and causes tensile stresses in the second direction and the third direction.

3. The piezoelectric actuator of claim 2, wherein the first electric field and the third electric field are applied simultaneously by the electrodes, and the second electric field and the fourth electric field are applied simultaneously by the electrodes.

4. The piezoelectric actuator of claim 1, wherein the first electric field is applied to the first plate simultaneously with the fourth electric field being applied to the second plate, and the second electric field is applied to the first plate simultaneously with the third electric field being applied to the second plate.

5. A piezoelectric actuator comprising:
   a first plate having a planar first plate surface and an oppositely disposed planar second plate surface separated by a first plate thickness;

a first electrode disposed on one of the planar first plate surface and the planar second plate surface and having a plurality of first fingers;

a second electrode disposed on the same one of the planar first plate surface and the planar second plate surface and having a plurality of second fingers alternated with the plurality of first fingers; and a flexible diaphragm having a first diaphragm surface and an oppositely disposed second diaphragm surface, wherein one of the planar first plate surface and the planar second plate surface of the first plate faces and is rigidly secured to the first diaphragm surface, wherein a first electric field applied through the first electrode and the second electrode causes in-plane tensile stresses to elongate the first plate in a first direction, causes in-plane compressive stresses in a second direction, and causes transverse compressive stresses in a third direction, and wherein a second electric field applied through the first electrode and the second electrode causes compressive stresses to compress the first plate in the first direction, and causes tensile stresses in the second direction and the third direction, wherein a third electric field applied through the third electrode and the fourth electrode causes in-plane tensile stresses to elongate the second plate in a fourth direction, causes in-plane compressive stresses in a fifth direction, and causes transverse compressive stresses in a sixth direction, and wherein a fourth electric field applied through the third electrode and the fourth electrode causes compressive stresses to compress the second plate in the fourth direction, and causes tensile stresses in the fifth direction and the sixth direction, and wherein the plurality of first fingers and the plurality of second fingers are arranged on the one of the planar first plate surface and the planar second plate surface so that a higher concentration of the plurality of first fingers and the plurality of second fingers exists in a first area of the first plate along the first direction than in a second area of the first plate along the first direction.

6. A piezoelectric actuator comprising:
a first plate having a planar first plate surface and an oppositely disposed planar second plate surface separated by a first plate thickness;
a first electrode disposed on one of the planar first plate surface and the planar second plate surface and having a plurality of first fingers;
a second electrode disposed on the same one of the planar first plate surface and the planar second plate surface and having a plurality of second fingers alternated with the plurality of first fingers; and
a flexible diaphragm having a first diaphragm surface and an oppositely disposed second diaphragm surface, wherein one of the planar first plate surface and the planar second plate surface of the first plate faces and is rigidly secured to the first diaphragm surface,
wherein a first electric field applied through the first electrode and the second electrode causes in-plane tensile stresses to elongate the first plate in a first direction, causes in-plane compressive stresses in a second direction, and causes transverse compressive stresses in a third direction, and wherein a second electric field applied through the first electrode and the second electrode causes compressive stresses to compress the first plate in the first direction, and causes tensile stresses in the second direction and the third direction, and wherein the first plate has a first thickness in a first area of the first plate and a second thickness that is less than the first thickness in a second area of the first plate such that the first electric field causes greater in-plane tensile stresses in the first area along the first direction than in the second area of the first plate along the first direction.

7. A synthetic jet for generating an air jet, the synthetic jet comprising:
a housing defining a hollow resonant chamber and having an orifice through a first wall of the housing placing the hollow resonant chamber in fluid communication with an ambient atmosphere surrounding the synthetic jet;
a flexible diaphragm forming a second wall of the housing and having a first diaphragm surface and an oppositely disposed second diaphragm surface;
a first plate having a planar first plate surface and an oppositely disposed planar second plate surface separated by a first plate thickness, wherein one of the planar first plate surface and the planar second plate surface of the first plate faces and is rigidly secured to the first diaphragm surface;
a second plate having a planar third plate surface and an oppositely disposed planar fourth plate surface separated by a second plate thickness, wherein one of the planar third plate surface and the planar fourth plate surface of the second plate faces and is rigidly secured to the second diaphragm surface;
a first electrode disposed on one of the planar first plate surface and the planar second plate surface and having a plurality of first fingers;
a second electrode disposed on the same one of the planar first plate surface and the planar second plate surface and having a plurality of second fingers alternated with the plurality of first fingers;
a third electrode disposed on one of the planar third plate surface and the planar fourth plate surface and having a plurality of third fingers; and
a fourth electrode disposed on the same one of the planar third plate surface and the planar fourth plate surface and having a plurality of fourth fingers alternated with the plurality of third fingers,
wherein a first electric field applied through the first electrode and the second electrode causes in-plane tensile stresses to elongate the first plate in a first direction, causes in-plane compressive stresses in a second direction, and causes transverse compressive stresses in a third direction, and wherein a second electric field applied through the first electrode and the second electrode causes compressive stresses to compress the first plate in the first direction, and causes tensile stresses in the second direction and the third direction, and
wherein a third electric field applied through the third electrode and the fourth electrode causes in-plane tensile stresses to elongate the second plate in a fourth direction, causes in-plane compressive stresses in a fifth direction, and causes transverse compressive stresses in a sixth direction, and wherein a fourth electric field applied through the third electrode and the fourth electrode causes compressive stresses to compress the second plate in the fourth direction, and causes tensile stresses in the fifth direction and the sixth direction and wherein the first plate and the second plate are rigidly secured to the flexible diaphragm with the first direction of the first plate aligned parallel to the fourth direction of the second plate.

8. The synthetic jet of claim 7, comprising
a third electrode disposed on the other of the planar first plate surface and the planar second plate surface and having a plurality of third fingers; and
a fourth electrode disposed on the other of the planar first plate surface and the planar second plate surface and having a plurality of fourth fingers alternated with the plurality of third fingers,
wherein a third electric field applied through the third electrode and the fourth electrode causes in-plane tensile stresses to elongate the first plate in the first direction, causes in-plane compressive stresses in the second direction, and causes transverse compressive stresses in the third direction, wherein a fourth electric field applied through the third electrode and the fourth electrode causes compressive stresses to compress the first plate in the first direction, and causes tensile stresses in the second direction and the third direction.

9. The synthetic jet of claim 8, wherein the first electric field and the third electric field are applied simultaneously by the electrodes, and the second electric field and the fourth electric field are applied simultaneously by the electrodes.

10. The synthetic jet of claim 7, wherein the first electric field is applied to the first plate simultaneously with the fourth electric field being applied to the second plate, and the second electric field is applied to the first plate simultaneously with the third electric field being applied to the second plate.

11. A synthetic jet for generating an air jet, the synthetic jet comprising:
a housing defining a hollow resonant chamber and having an orifice through a first wall of the housing placing the hollow resonant chamber in fluid communication with an ambient atmosphere surrounding the synthetic jet;
a flexible diaphragm forming a second wall of the housing and having a first diaphragm surface and an oppositely disposed second diaphragm surface;
a first plate having a planar first plate surface and an oppositely disposed planar second plate surface separated by a first plate thickness, wherein one of the planar first plate surface and the planar second plate surface of the first plate faces and is rigidly secured to the first diaphragm surface;
a first electrode disposed on one of the planar first plate surface and the planar second plate surface and having a plurality of first fingers; and
a second electrode disposed on the same one of the planar first plate surface and the planar second plate surface and having a plurality of second fingers alternated with the plurality of first fingers,
wherein a first electric field applied through the first electrode and the second electrode causes in-plane tensile stresses to elongate the first plate in a first direction, causes in-plane compressive stresses in a second direction, and causes transverse compressive stresses in a third direction, and wherein a second electric field applied through the first electrode and the second electrode causes compressive stresses to compress the first plate in the first direction, and causes tensile stresses in the second direction and the third direction, and
wherein the plurality of first fingers and plurality of second fingers are arranged on the one of the planar first plate surface and the planar second plate surface so that the first electric field cause greater in-plane tensile stresses in a first area of the first plate along the first direction than in a second area of the first plate along the first direction.

12. A synthetic jet for generating an air jet, the synthetic jet comprising:
a housing defining a hollow resonant chamber and having an orifice through a first wall of the housing placing the hollow resonant chamber in fluid communication with an ambient atmosphere surrounding the synthetic jet;
a flexible diaphragm forming a second wall of the housing and having a first diaphragm surface and an oppositely disposed second diaphragm surface;
a first orthotropic plate having a planar first plate surface and an oppositely disposed planar second plate surface separated by a first plate thickness, wherein one of the planar first plate surface and the planar second plate surface of the first plate faces and is rigidly secured to the first diaphragm surface, wherein the first orthotropic plate has a first direction in the plane of the first orthotropic plate, a second direction in the plane of the first orthotropic plate, and a third direction transverse to the plane of the first orthotropic plate, and wherein the first orthotropic plate has a first d coupling coefficient in the first direction that is greater than a second d coupling coefficient in the second direction;
a first electrode disposed on one of the planar first plate surface and the planar second plate surface; and
a second electrode disposed on one of the planar first plate surface and the planar second plate surface, wherein a first electric field applied through the first electrode and the second electrode causes in-plane tensile stresses to elongate the first orthotropic plate in the first direction, and wherein a second electric field applied through the first electrode and the second electrode causes compressive stresses to compress the first orthotropic plate in the first direction.

13. The synthetic jet of claim 12, wherein the first electrode is disposed on the planar first plate surface and the second electrode is disposed on the planar second plate surface.

14. The synthetic jet of claim 12, wherein the first electrode is disposed on the planar first plate surface and has a plurality of first fingers, and wherein the second electrode is disposed on the planar first plate surface and has a plurality of second fingers alternated with the plurality of first fingers.

15. The synthetic jet of claim 12, comprising
a second orthotropic plate having a planar third plate surface and an oppositely disposed planar fourth plate surface separated by a second plate thickness, wherein one of the planar third plate surface and the planar fourth plate surface of the second orthotropic plate faces and is rigidly secured to the second diaphragm surface, wherein the second orthotropic plate has a fourth direction in the plane of the second orthotropic plate, a fifth direction in the plane of the second orthotropic plate, and a sixth direction transverse to the plane of the second orthotropic plate, and wherein the second orthotropic plate has a third d coupling coefficient in the fourth direction that is greater than a fourth d coupling coefficient in the fifth direction;
a third electrode disposed on one of the planar third plate surface and the planar fourth plate surface; and
a fourth electrode disposed on one of the planar third plate surface and the planar fourth plate surface, wherein a third electric field applied through the third electrode and the fourth electrode causes in-plane tensile stresses to elongate the second orthotropic plate in the fourth direction, and wherein a fourth electric field applied through the third electrode and the fourth electrode causes compressive stresses to compress the second orthotropic plate in the fourth direction.

16. The synthetic jet of claim 12, wherein the first d coupling coefficient in the first direction has a variable value so that the first electric field causes greater in-plane tensile stresses in a first area of the first orthotropic plate along the first direction than in a second area of the first orthotropic plate along the first direction.

17. The synthetic jet of claim 12, wherein the first orthotropic plate comprises:
   a bundle formed by a plurality of piezoceramic fibers aligned side-by-side across a plate width of the first orthotropic plate in the second direction; and
   an interstitial material encasing the bundle formed by the plurality of piezoceramic fibers.

* * * * *